United States Patent
Lu et al.

(10) Patent No.: US 9,543,359 B2
(45) Date of Patent: Jan. 10, 2017

(54) SWITCHING DEVICE HAVING A NON-LINEAR ELEMENT

(71) Applicant: Crossbar, Inc., Santa Clara, CA (US)

(72) Inventors: Wei Lu, Ann Arbor, MI (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/573,770

(22) Filed: Dec. 17, 2014

(65) Prior Publication Data

US 2015/0102281 A1    Apr. 16, 2015

Related U.S. Application Data

(63) Continuation of application No. 13/960,735, filed on Aug. 6, 2013, now Pat. No. 8,952,349, which is a continuation of application No. 13/149,757, filed on May 31, 2011, now Pat. No. 8,502,185.

(51) Int. Cl.

| | | |
|---|---|---|
| *H01L 27/24* | (2006.01) | |
| *H01L 45/00* | (2006.01) | |
| *G11C 11/00* | (2006.01) | |
| *H01L 27/10* | (2006.01) | |

(52) U.S. Cl.
CPC ......... *H01L 27/2409* (2013.01); *H01L 27/101* (2013.01); *H01L 27/2463* (2013.01); *H01L 45/085* (2013.01); *H01L 45/1233* (2013.01); *H01L 45/148* (2013.01)

(58) Field of Classification Search
CPC ............. H01L 27/2409; H01L 27/2463; H01L 27/101; H01L 45/1233; H01L 45/085; H01L 45/148
USPC .... 365/129, 148, 163; 257/2, 3, 4, 195, 196, 257/E27.004, E45.002, E47.001, E21.004, 257/E21.068; 438/2, 4, 5, 95, 97, 382
See application file for complete search history.

(56) References Cited

U.S. PATENT DOCUMENTS

| | | |
|---|---|---|
| 680,652 A | 8/1901 | Leonard |
| 4,433,468 A | 2/1984 | Kawamata |
| 4,684,972 A | 8/1987 | Owen et al. |
| 4,741,601 A | 5/1988 | Saito |
| 4,994,866 A | 2/1991 | Awano |
| 5,139,911 A | 8/1992 | Yagi et al. |

(Continued)

FOREIGN PATENT DOCUMENTS

| | | |
|---|---|---|
| CN | 101131872 A | 2/2008 |
| CN | 101170132 A | 4/2008 |

(Continued)

OTHER PUBLICATIONS

International Search Report and Written Opinion for PCT Patent Application No. PCT/US2012/040232 filed on May 31, 2012.

(Continued)

*Primary Examiner* — Dao H Nguyen
(74) *Attorney, Agent, or Firm* — Amin, Turocy & Watson, LLP

(57) ABSTRACT

A switching device includes a substrate; a first electrode formed over the substrate; a second electrode formed over the first electrode; a switching medium disposed between the first and second electrode; and a nonlinear element disposed between the first and second electrodes and electrically coupled in series to the first electrode and the switching medium. The nonlinear element is configured to change from a first resistance state to a second resistance state on application of a voltage greater than a threshold.

20 Claims, 8 Drawing Sheets

(56) References Cited

U.S. PATENT DOCUMENTS

| | | |
|---|---|---|
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,791,060 B2 | 9/2010 | Aochi et al. |
| 7,824,956 B2 | 11/2010 | Schricker et al. |
| 7,829,875 B2 | 11/2010 | Scheuerlein |
| 7,830,698 B2 * | 11/2010 | Chen et al. .................. 365/148 |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |

(56) References Cited

U.S. PATENT DOCUMENTS

| | | |
|---|---|---|
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 * | 11/2012 | Nazarian ...................... 365/148 |
| 8,351,241 B2 | 1/2013 | Lu et al. |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1 | 4/2002 | Derderian et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu et al. |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0231910 A1 | 10/2006 | Hsieh et al. |
| 2006/0246606 A1 | 11/2006 | Hsu et al. |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1 | 2/2007 | Hush |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner et al. |
| 2007/0090425 A1 | 4/2007 | Kumar et al. |
| 2007/0091685 A1 | 4/2007 | Guterman et al. |
| 2007/0105284 A1 | 5/2007 | Herner et al. |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1 | 1/2009 | Lu et al. |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0268513 A1 | 10/2009 | De Ambroggi et al. |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |

(56) References Cited

U.S. PATENT DOCUMENTS

| | | |
|---|---|---|
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1* | 9/2010 | Tsukamoto ......... G11C 11/5678 257/3 |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1* | 12/2011 | Lu et al. ............ G11C 13/0007 365/148 |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1* | 12/2012 | Lu et al. ............................ 257/4 |
| 2012/0320660 A1 | 12/2012 | Nazarian et al. |
| 2012/0326265 A1 | 12/2012 | Lai et al. |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1 | 9/2014 | Jo |
| 2014/0269002 A1 | 9/2014 | Jo |
| 2014/0312296 A1 | 10/2014 | Jo et al. |
| 2014/0335675 A1 | 11/2014 | Narayanan |
| 2016/0111640 A1 | 4/2016 | Chang et al. |

FOREIGN PATENT DOCUMENTS

| | | |
|---|---|---|
| CN | 101501850 A | 8/2009 |
| CN | 101636792 A | 1/2010 |
| CN | 102024494 A | 4/2011 |
| CN | 102077296 A | 5/2011 |
| EP | 1096465 A2 | 5/2001 |

(56) References Cited

FOREIGN PATENT DOCUMENTS

| | | | |
|---|---|---|---|
| EP | 2405441 A1 | 1/2012 | |
| EP | 2408035 A2 | 1/2012 | |
| JP | 2005506703 A | 3/2005 | |
| JP | 2006032951 A | 2/2006 | |
| JP | 2007067408 A | 3/2007 | |
| JP | 2007281208 A | 10/2007 | |
| JP | 2007328857 A | 12/2007 | |
| JP | 2008503085 A | 1/2008 | |
| JP | 2008147343 A | 6/2008 | |
| JP | 2009043873 A | 2/2009 | |
| JP | 2011-23645 A1 | 2/2011 | |
| JP | 2011065737 A | 3/2011 | |
| JP | 2012504840 A | 2/2012 | |
| JP | 2012505551 A | 3/2012 | |
| JP | 2012089567 A | 5/2012 | |
| JP | 2012533195 A | 12/2012 | |
| KR | 20090051206 A | 5/2009 | |
| KR | 20110014248 A | 2/2011 | |
| WO | 03034498 A1 | 4/2003 | |
| WO | 2005124787 A2 | 12/2005 | |
| WO | 2009005699 A1 | 1/2009 | |
| WO | 2010026654 A | 3/2010 | |
| WO | 2010042354 A1 | 4/2010 | |
| WO | 2010042732 A2 | 4/2010 | |
| WO | 2011008654 A1 | 1/2011 | |
| WO | WO 2011/005266 A1 | 1/2011 | |
| WO | 2011133138 A1 | 10/2011 | |

OTHER PUBLICATIONS

Notice of Allowance for U.S. Appl. No. 13/585,759 dated Sep. 19, 2013.
Office Action for U.S. Appl. No. 13/921,157 dated Oct. 3, 2013.
Office Action for U.S. Appl. No. 13/960,735, dated Dec. 6, 2013.
International Search Report and Written Opinion for PCT/US2013/054976, filed on Aug. 14, 2013.
Notice of Allowance for U.S. Appl. No. 13/592,224, dated Mar. 17, 2014.
Office Action for U.S. Appl. No. 13/426,869 dated Sep. 12, 2014.
Notice of Allowance for U.S. Appl. No. 13/426,869 dated Oct. 21, 2014.
Notice of Allowance for U.S. Appl. No. 13/960,735, dated Sep. 17, 2014.
Office Action mailed Mar. 1, 2012 for U.S. Appl. No. 12/835,704, filed Jul. 13, 2010.
Office Action mailed Aug. 2, 2013 for U.S. Appl. No. 13/594,665, filed Aug. 24, 2012.
Office Action mailed Sep. 2, 2014 for U.S. Appl. No. 13/705,082, 41 pages.
Office Action mailed Apr. 3, 2014 for U.S. Appl. No. 13/870,919, filed Apr. 25, 2013.
Office Action mailed Apr. 5, 2012 for U.S. Appl. No. 12/833,898, filed Jul. 9, 2010.
Office Action mailed Oct. 5, 2011 for U.S. Appl. No. 11/875,541, filed Oct. 19, 2007.
Office Action mailed Apr. 6, 2015 for U.S. Appl. No. 14/034,390, filed Sep. 23, 2013.
Office Action mailed Dec. 6, 2013 for U.S Appl. No. 13/564,639, filed Aug. 1, 2012.
Office Action mailed Feb. 6, 2014 for U.S. Appl. No. 13/434,567, filed Mar. 29, 2012.
Office Action mailed Mar. 6, 2013 for U.S. Appl. No. 13/174,264, filed Jun. 30, 2011.
Office Action mailed Mar. 6, 2013 for U.S. Appl. No. 13/679,976, filed Nov. 16, 2012.
Office Action mailed Sep. 6, 2011 for U.S. Appl. No. 12/582,086, filed Oct. 20, 2009.
Office Action mailed Dec. 7, 2012 for U.S Appl. No. 13/436,714, filed Mar. 30, 2012.
Office Action mailed Mar. 7, 2013 for U.S. Appl. No. 13/651,169, filed Oct. 12, 2012.
Office Action mailed May 7, 2013 for U.S. Appl. No. 13/585,759, filed Aug. 14, 2012.
Office Action mailed Aug. 8, 2012 for EP Application No. EP11005207 filed Jun. 27, 2011.
Office Action mailed Jan. 8, 2014 for U.S. Appl. No. 12/861,432, filed Aug. 23, 2010.
Office Action mailed Jun. 8, 2012 for U.S. Appl. No. 11/875,541, filed Oct. 19, 2007.
Office Action mailed Aug. 9, 2013 for U.S. Appl.No. 13/764,710, filed Feb. 11, 2013.
Office Action mailed Jul. 9, 2013 for U.S. Appl. No. 13/447,036, filed Apr. 13, 2012.
Office Action mailed Jul. 9, 2014 for U.S. Appl. No. 14/166,691, filed Jan. 28, 2014.
Office Action mailed Oct. 9, 2012 for U.S. Appl. No. 13/417,135, filed Mar. 9, 2012.
Office Action mailed Jan. 10, 2014 for U.S. Appl. No. 13/920,021, filed Jun. 17, 2013.
Office Action mailed Apr. 11, 2014 for U.S. Appl. No. 13/143,047, filed Jun. 30, 2011.
Office Action mailed Feb. 11, 2014 for U.S. Appl. No. 13/620,012, filed Sep. 14, 2012.
Office Action mailed Jul. 11, 2013 for U.S. Appl. No. 13/764,698, filed Feb. 11, 2013.
Office Action mailed Sep. 11, 2014 for U.S. Appl. No. 13/739,283, filed Jan. 11, 2013.
Office Action mailed Aug. 12, 2013 for U.S. Appl. No. 13/077,941, filed Mar. 31, 2011.
Office Action mailed Mar. 12, 2014 for U.S. Appl. No. 13/167,920, filed Jun. 24, 2011.
Office Action mailed Sep. 12, 2014 for U.S. Appl. No. 13/756,498.
Office Action mailed Dec. 3, 2015 for U.S. Appl. No. 14/253,796.
Office Action mailed Feb. 13, 2014 for U.S. Appl. No. 13/174,077, filed Jun. 30, 2011.
Office Action mailed Mar. 14, 2012 for U.S. Appl. No. 12/815,369, filed Jun. 14, 2010.
Office Action mailed Mar. 14, 2014 for U.S. Appl. No. 12/835,704, filed Jul. 13, 2010.
Office Action mailed Apr. 15, 2016 for U.S. Appl. No. 14/597,151.
Office Action mailed Apr. 16, 2012 for U.S. Appl. No. 12/834,610, filed Jul. 12, 2010.
Office Action mailed Jan. 16, 2014 for U.S. Appl. No. 13/739,283, filed Jan. 11, 2013.
Office Action mailed May 16, 2012 for U.S. Appl. No. 12/815,318, filed Jun. 14, 2010.
Office Action mailed Oct. 16, 2012 for U.S. Appl. No. 12/861,650, filed Aug. 23, 2010.
Office Action mailed Apr. 17, 2012 for U.S. Appl. No. 12/814,410, filed Jun. 11, 2010.
Office Action mailed Feb. 17, 2011 for U.S. Appl. No. 12/913,719, filed Oct. 27, 2010.
Office Action mailed Jun. 17, 2014 for U.S. Appl. No. 14/072,657, filed Nov. 5, 2013.
Office Action mailed Apr. 19, 2011 for U.S. Appl. No. 12/582,086, filed Oct. 20, 2009.
Office Action mailed Aug. 19, 2013 for U.S. Appl. No. 13/585,759, filed Aug. 14, 2012.
Office Action mailed Jun. 19, 2012 for U.S. Appl. No. 13/149,757, filed May 31, 2011.
Office Action mailed Mar. 19, 2013 for U.S. Appl. No. 13/465,188, filed May 7, 2012.
Office Action mailed Mar. 19, 2013 for U.S. Appl. No. 13/564,639, filed Aug. 1, 2012.
Office Action mailed May 20, 2013 for U.S. Appl. No. 13/725,331, filed Dec. 21, 2012.
Office Action mailed Nov. 20, 2012 for U.S Appl. No. 13/149,653, filed May 31, 2011.
Office Action mailed Sep. 20, 2013 for U.S. Appl. No. 13/481,600, filed May 25, 2012.
International Search Report and Written Opinion for Application No. PCT/US2012/045312, mailed on Mar. 29, 2013, 11 pages.

(56) References Cited

OTHER PUBLICATIONS

International Search Report and Written Opinion for Application No. PCT/US2013/042746, mailed on Sep. 6, 2013, 7 pages.
International Search Report and Written Opinion for Application No. PCT/US2013/061244, mailed on Jan. 28, 2014, 8 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.
International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
International Search Report for Application No. PCT/US2011/046036, mailed on Feb. 23, 2012, 3 pages.
Jafar M., et al., "Switching in Amorphous-silicon Devices," Physical Review, 1994, vol. 49 (19), pp. 611-615.
Japanese Office Action and English Translation for Japanese Patent Application No. 2011-153349 mailed Feb. 24, 2015, 9 pages.
Japanese Office Action and English Translation for Japanese Patent Application No. 2011-153349 mailed Mar. 24, 2015, 9 pages.
Japanese Office Action (English Translation) for Japanese Application No. 2011-153349 mailed Feb. 24, 2015, 3 pages.
Japanese Office Action (English Translation) for Japanese Application No. 2013-525926 mailed Mar. 3, 2015, 4 pages.
Japanese Office Action (English Translation) for Japanese Application No. 2014-513700 mailed Jan. 12, 2016, 4 pages.
Japanese Search Report (English Translation) for Japanese Application No. 2013-525926 dated Feb. 9, 2015, 15 pages.
Japanese Search Report (English Translation) for Japanese Application No. 2011-153349 dated Feb. 9, 2015, 11 pages.
Japanese Search Report (English Translation) for Japanese Application No. 2014-513700 dated Jan. 14, 2016, 25 pages.
Jian Hu., et al., "Area-Dependent Switching In Thin Film-Silicon Devices," Materials Research Society Symposium Proceedings, 2003, vol. 762, pp. A 18.3.1-A 18.3.6.
Jian Hu., et al., "Switching and Filament Formation in hot-wire CVD p-type a-Si:H devices," Thin Solid Films, Science Direct, 2003, vol. 430, pp. 249-252.
Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.
Jo S.H., et al., "Experimental, Modeling and Simulation Studies of Nanoscale Resistance Switching Devices", Conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S.H. et al., "High-Density Crossbar Arrays Based on a Si Memristive System", Supporting Information, 2009, pp. 1-4.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Jo S.H., et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H., et al., "Nonvolatile Resistive Switching Devices Based on Nanoscale Metal/Amorphous Silicon/Crystalline Silicon Junctions," Materials Research Society Symposium Proceedings, 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, 2009, pp. 1-4.
Kuk-Hwan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand, "Materials Engineering Science," MESc. 5025 Lecture Notes: Chapter 7. Diffusion, University of Vermont. Retrieved from the Internet on Aug. 8, 2016.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Notice of Allowance dated Dec. 19, 2014 for U.S. Appl. No. 13/529,985, 9 pgs.
Notice of Allowance dated Jul. 1, 2016 for U.S. Appl. No. 14/213,953, 96 pages.
Office Action mailed Mar. 21, 2014 for U.S. Appl. No. 13/447,036, filed Apr. 13, 2012.
Office Action mailed May 21, 2014 for U.S. Appl. No. 13/764,698, filed Feb. 11, 2013.
Office Action mailed Sep. 21, 2011 for U.S. Appl. No. 12/835,704, filed Jul. 13, 2010.
Office Action mailed Jul. 22, 2010 for U.S. Appl. No. 11/875,541, filed Oct. 19, 2007.
Office Action mailed Jul. 22, 2011 for U.S. Appl. No. 12/913,719, filed Oct. 27, 2010.
Office Action mailed Sep. 22, 2013 for U.S. Appl. No. 13/189,401, filed Jul. 22, 2011.
Office Action mailed May 23, 2013 for U.S. Appl. No. 13/592,224, filed Aug. 22, 2012.
Office Action mailed Aug. 24, 2011 for U.S. Appl. No. 12/835,699, filed Jul. 13, 2010.
Office Action mailed Apr. 25, 2012 for U.S. Appl. No. 13/149,653, filed May 31, 2011.
Office Action mailed Apr. 25, 2014 for U.S. Appl. No. 13/761,132, filed Feb. 6, 2013.
Office Action mailed Jan. 25, 2012 for U.S. Appl. No. 12/861,650, filed Aug. 23, 2010.

(56) References Cited

OTHER PUBLICATIONS

Office Action mailed Oct. 25, 2012 for U.S. Appl. No. 13/461,725, filed May 1, 2012.
Office Action mailed Sep. 25, 2013 for U.S. Appl. No. 13/194,479, filed Jul. 29, 2011.
Office Action mailed Nov. 26, 2012 for U.S Appl. No. 13/156,232.
Office Action mailed Aug. 27, 2013 for U.S. Appl. No. 13/436,714, filed Mar. 30, 2012.
Office Action mailed Dec. 27, 2013 for U.S. Appl. No. 13/525,096, filed Jun. 15, 2012.
Office Action mailed Mar. 27, 2012 for U.S. Appl. No. 13/314,513, filed Dec. 8, 2011.
Office Action mailed Feb. 28, 2014 for U.S. Appl. No. 12/625,817, filed Nov. 25, 2009.
Office Action mailed Jan. 29, 2014 for U.S. Appl. No. 13/586,815, filed Aug. 15, 2012.
Office Action mailed Jul. 29, 2013 for U.S. Appl. No. 13/466,008, filed May 7, 2012.
Office Action mailed Mar. 29, 2013 for U.S. Appl. No. 12/861,432, filed Aug. 23, 2010.
Office Action mailed Jul. 30, 2012 for U.S. Appl. No. 12/900,232, filed Oct. 7, 2010.
Office Action mailed Jun. 30, 2014 for U.S. Appl. No. 13/531,449, filed Jun. 22, 2012.
Office Action mailed Mar. 30, 2011 for U.S. Appl. No. 11/875,541, filed Oct. 19, 2007.
Office Action mailed Sep. 30, 2013 for U.S. Appl. No. 13/189,401, filed Jul. 22, 2011.
Office Action mailed Sep. 30, 2013 for U.S. Appl. No. 13/462,653, filed May 2, 2012.
Office Action mailed Apr. 6, 2015 for U.S. Appl. No. 14/034,390.
Office Action mailed May 20, 2016 for U.S. Appl. No. 14/613,299.
Office Action mailed Jul. 9, 2015 for U.S. Appl. No. 14/573,817.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 830-833.
Owen A.E., et al., "Memory Switching In Amorphous Silicon Devices," Journal of Non- Crystalline Solids, 1983, vol. 50-60 (Pt.2), pp. 1273-1280.
Owen A.E., et al., "New Amorphous-Silicon Electrically Programmable Nonvolatile Switching Device," Solid-State and Electron Devices, IEEE Proceedings, 1982, vol. 129 (Pt. 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman a., Polymer Memory—The Plastic Path to Better Data Storage, Technology Review, Sep. 2002, pp. 31 Retrieved from the Internet.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Sune J., et al., "Nondestructive Multiple Breakdown Events in Very Thin Si02 Films," Applied Physics Letters, 1989, vol. 55, pp. 128-130.
Terabe K., et al., "Quantized Conductance Atomic Switch," Nature, 2005, vol. 433, pp. 47-50.
Waser R., et al., "Nanoionics-based Resistive Switching Memories," Nature Materials, 2007, vol. 6, pp. 833-835.
Written Opinion for Application No. PCT/US2009/060023, mailed on May 18, 2010, 3 pages.
Written Opinion for Application No. PCT/US2009/061249, mailed on May 19, 2010, 3 pages.
Written Opinion for Application No. PCT/US2011/040090, mailed on Feb. 17, 2012, 6 pages.
Written Opinion for Application No. PCT/US2011/045124, mailed on May 29, 2012, 5 pages.
Written Opinion for Application No. PCT/US2011/046036, mailed on Feb. 23, 2012, 4 pages.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet.
Yuan H.C., et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Zankovych S., et al., "Nanoimprint Lithography: Challenges and Prospects," Nanotechnology, 2001, vol. 12, pp. 91-95.
Advisory Action mailed Jun. 8, 2012 for U.S Appl. No. 12/835,704, filed Jul. 13, 2012.
Avila A., et al., "Switching in Coplanar Amorphous Hydrogenated Silicon Devices," Solid-State Electronics, 2000, vol. 44 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 6 pages.
Chinese Office Action (English Translation) for Chinese Application No 201110195933.7 dated Jul. 31, 2014, 4 pages.
Chinese Office Action (English Translation) for Chinese Application No 201110195933.7 dated May 18, 2015, 4 pages.
Chinese Office Action (English Translation) for Chinese Application No 201180050941.0 dated Dec. 9, 2015, 5 pages.
Chinese Office Action (with English Translation) for Chinese Application No. 201280027066.9 mailed on Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
Corrected Notice of Allowability mailed Oct. 1, 2013 for U.S. Appl. No. 13/733,828, filed Jan. 3, 2013.
Corrected Notice of Allowance mailed Jan. 11, 2013 for U.S. Appl. No. 12/861,666 dated Aug. 23, 2010.
Dehon A., "Array-Based Architecture for FET-Based, Nanoscale Electronics," IEEE Transactions on Nanotechnology, 2003, vol. 2 (1), pp. 23-32.

(56) References Cited

OTHER PUBLICATIONS

Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 312-813.
Dey S.K., "Electrothermal Model of Switching in Amorphous Silicon Films," Journal of Vacuum Science & Technology, 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Search Report for Application No. EP09819890.6 mailed on Mar. 27, 2012.
European Search Report for Application No. EP11005207.3 mailed on Oct. 12, 2011.
European Search Report for Application No. EP14000949, mailed on Jun. 4, 2014, 7 pages.
European Search Report for European Application No. EP11005649 mailed Oct. 15, 2014, 2 pages.
Ex parte Quayle Action mailed May 8, 2012 for U.S. Appl. No. 12/826,653, filed Jun. 29, 2010.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096, filed Jun. 15, 2012.
Gangopadhyay S., et al., "Memory Switching in Sputtered Hydrogenated Amorphous Silicon (a—Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet.
Hajto J., et al., "Amorphous & Microcrystalline Semiconductor Devices: Materials and Device Physics", Artech House Publishers, Mar. 1, 2004, vol. 2, pp. 640-700.
Hajto J., et al., "Analogue Memory and Ballistic Electron Effects in Metal-amorphous Silicon Structures," Philosophical Magazine, 1991, vol. 63 (1), pp. 349-369.
Hajto J., et al., "Electronic Switching in Amorphous-Semiconductor Thin Films", Chapter 14, 1992, pp. 640-701.
Hajto J., et al., "The Programmability of Amorphous Silicon Analogue Memory Elements," Materials Research Society Symposium Proceedings, 1990, vol. 192, pp. 405-410.
Holmes A.J., et al., "Design of Analogue Synapse Circuits using Non-Volatile a—Si:H Memory Devices", Proceedings of IEEE International Symposium on Circuits and System, 1994, pp. 351-354, vol. 6.
Hu J., et al., "AC Characteristics of Cr/p. sup.+a—Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 2009, pp. 1-9.
Hudgens S., et al., "Overview of Phase-Change Chalcogenide Nonvolatile Memory Technology", MRS Bulletin, Nov. 2004, pp. 829-832. Retrieved from the Internet.
International Search Report and Written Opinion for Application No. PCT/US2011/040362, mailed on Jan. 19, 2012, 7 pages.
International Search Report and Written Opinion for Application No. PCT/US2011/046035, mailed on Mar. 27, 2012, 6 pages.
International Search Report and Written Opinion for Application No. PCT/US2012/040242, mailed on Jan. 31, 2013, 9 pages.
International Search Report and Written Opinion for Application No. PCT/US2012/044077, mailed on Jan. 25, 2013, 9 pages.
Notice of Allowance mailed Mar. 20, 2014 for U.S. Appl. No. 13/461,725, filed May 1, 2012.
Notice of Allowance mailed Oct. 21, 2011 for U.S. Appl. No. 12/582,086, filed Oct. 20, 2009.
Notice of Allowance mailed Feb. 10, 2015 for U.S. Appl. No. 13/525,096, filed Jun. 15, 2012.
Notice of Allowance mailed May 22, 2012 for U.S. Appl. No. 12/815,369, filed Jun. 14, 2010.
Notice of Allowance mailed Oct. 23, 2013 for U.S. Appl. No. 13/417,135, filed Mar. 9, 2012.
Notice of Allowance mailed Jan. 24, 2013 for U.S. Appl. No. 13/314,513, filed Dec. 8, 2011.
Notice of Allowance mailed Jul. 24, 2012 for U.S. Appl. No. 12/939,824, filed Nov. 4, 2010.
Notice of Allowance mailed Oct. 25, 2012 for U.S. Appl. No. 12/894,087, filed Sep. 29, 2010.
Notice of Allowance mailed Sep. 25, 2014 for U.S. Appl. No. 13/447,036, filed Apr. 13, 2012.
Notice of Allowance mailed Sep. 26, 2014 for U.S. Appl. No. 13/594,665, filed Aug. 24, 2012.
Notice of Allowance mailed Aug. 27, 2014 for U.S. Appl. No. 13/077,941, filed Mar. 31, 2011.
Notice of Allowance mailed Nov. 28, 2012 for U.S. Appl. No. 13/290,024, filed Nov. 4, 2011.
Notice of Allowance mailed Oct. 28, 2013 for U.S. Appl. No. 13/194,500, filed Jul. 29, 2011.
Notice of Allowance mailed Oct. 28, 2013 for U.S. Appl. No. 13/651,169, filed Oct. 12, 2012.
Notice of Allowance mailed Nov. 29, 2012 for U.S. Appl. No. 12/815,318, filed Jun. 14, 2010.
Notice of Allowance mailed Oct. 29, 2012 for U.S. Appl. No. 13/149,807, filed May 31, 2011.
Notice of Allowance mailed May 30, 2012 for U.S. Appl. No. 12/833,898, filed Jul. 9, 2010.
Notice of Allowance mailed Sep. 30, 2013 for U.S. Appl. No. 13/481,696, filed May 25, 2012.
Notice of Allowance mailed Aug. 31, 2012 for U.S. Appl. No. 13/051,296, filed Mar. 18, 2011.
Notice of Allowance mailed Apr. 20, 2016 for U.S. Appl. No. 14/573,817.
Notice of Allowance mailed Oct. 8, 2014 for U.S. Appl. No. 13/077,941, filed Mar. 31, 2011.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for European Application No. 11005649.6 dated Dec. 1, 2014, 2 pages.
Office Action for European Application No. 11005649.6 dated Nov. 17, 2015, 5 pages.
Office Action for European Application No. EP11005207.3 dated Aug. 8, 2012, 4 pages.
Office Action for U.S. Appl. No. 13/463,714 dated Dec. 7, 2012.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.

(56) References Cited

OTHER PUBLICATIONS

Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Office Action for U.S. Appl. No. 14/887,050 dated Mar. 11, 2016, 12 pages.
Office Action for U.S. Appl. No. 15/046,172 dated Apr. 20, 2016, 8 pages.
Office Action mailed Apr. 1, 2013 for U.S. Appl. No. 13/174,077, filed Jun. 30, 2011.
Office Action mailed Aug. 1, 2012 for U.S. Appl. No. 12/894,098, filed Sep. 29, 2010.
Notice of Allowance dated Jul. 17, 2014 for U.S. Appl. No. 12/861,432, 25 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S Appl. No. 14/509,967 dated Feb. 17, 2016, 18 pages.
Notice of Allowance for U.S Appl. No. 14/509,967 dated Jun. 16, 2016, 96 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Sep. 4, 2014 for U.S. Appl. No. 13/761,132, filed Feb. 6, 2013.
Notice of Allowance mailed Oct. 5, 2011 for U.S. Appl. No. 12/940,920, filed Nov. 5, 2010.
Notice of Allowance mailed Feb. 6, 2012 for U.S. Appl. No. 12/835,699, filed Jul. 13, 2010.
Notice of Allowance mailed Feb. 6, 2013 for U.S. Appl. No. 13/118,258, filed May 27, 2011.
Notice of Allowance mailed Aug. 8, 2013 for U.S. Appl. No. 13/733,828, filed Jan. 3, 2013.
Notice of Allowance mailed Jan. 8, 2013 for U.S. Appl. No. 12/814,410, filed Jun. 11, 2010.
Notice of Allowance mailed Oct. 8, 2013 for U.S. Appl. No. 13/769,152, filed Feb. 15, 2013.
Notice of Allowance mailed Oct. 8, 2013 for U.S. Appl. No. 13/905,074, filed May 29, 2013.
Notice of Allowance mailed Apr. 9, 2013 for U.S. Appl. No. 13/748,490, filed Jan. 23, 2013.
Notice of Allowance mailed Sep. 9, 2014 for U.S. Appl. No. 13/620,012, filed Sep. 14, 2012.
Notice of Allowance mailed Sep. 9, 2014 for U.S. Appl. No. 13/870,919, filed Apr. 25, 2013.
Notice of Allowance mailed Oct. 10, 2013 for U.S. Appl. No. 13/452,657, filed Apr. 20, 2012.
Notice of Allowance mailed Jan. 11, 2013 for U.S. Appl. No. 12/894,087, filed Sep. 29, 2010.
Notice of Allowance mailed May 11, 2012 for U.S. Appl. No. 12/939,824, filed Nov. 4, 2010.
Notice of Allowance mailed Jan. 11, 2016 for U.S. Appl. No. 14/613,299.
Notice of Allowance mailed Mar. 12, 2012 for U.S. Appl. No. 12/913,719, filed Oct. 27, 2010.
Notice of Allowance mailed Jan. 20, 2016 for U.S. Appl. No. 14/034,390.
Notice of Allowance mailed Nov. 13, 2013 for U.S. Appl. No. 13/461,725, filed May 1, 2012.
Notice of Allowance mailed Nov. 14, 2012 for U.S. Appl. No. 12/861,666, filed Aug. 23, 2010.
Notice of Allowance mailed Nov. 14, 2012 for U.S. Appl. No. 13/532,019, filed Jun. 25, 2012.
Notice of Allowance mailed Mar. 15, 2013 for U.S. Appl. No. 12/894,098, filed Sep. 29, 2010.
Notice of Allowance mailed Jan. 16, 2014 for U.S. Appl. No. 13/921,157, filed Jun. 18, 2013.
Notice of Allowance mailed Oct. 16, 2013 for U.S. Appl. No. 13/174,264, filed Jun. 30, 2011.
Notice of Allowance mailed Apr. 17, 2012 for U.S. Appl. No. 13/158,231, filed Jun. 10, 2011.
Notice of Allowance mailed Jan. 17, 2014 for U.S. Appl. No. 13/725,331, filed Dec. 21, 2012.
Notice of Allowance mailed May 17, 2013 for U.S. Appl. No. 13/290,024.
Notice of Allowance mailed Sep. 17, 2013 for U.S. Appl. No. 13/679,976, filed Nov. 16, 2012.
Notice of Allowance mailed Sep. 17, 2014 for U.S. Appl. No. 13/462,653, filed May 2, 2012.
Notice of Allowance mailed Sep. 18, 2012 for U.S. Appl. No. 12/900,232, filed Oct. 7, 2010.
Notice of Allowance mailed Sep. 18, 2014 for U.S. Appl. No. 13/920,021, filed Jun. 17, 2013.
Notice of Allowance mailed Sep. 18, 2014 for U.S. Appl. No. 13/586,815, filed Aug. 15, 2012.
Notice of Allowance mailed Jun. 19, 2012 for U.S. Appl. No. 12/861,650, filed Aug. 23, 2010.
Notice of Allowance mailed Apr. 2, 2013 for U.S. Appl. No. 13/149,757, filed May 31, 2011.
Notice of Allowance mailed Feb. 20, 2014 for U.S. Appl. No. 13/468,201, filed May 10, 2012.
Notice of Allowance mailed Mar. 20, 2014 for U.S. Appl. No. 13/598,550, filed Aug. 29, 2012.
Office Action dated Aug. 12, 2016 for U.S. Appl. No. 14/667,346, 27 pages.
Office Action dated Aug. 12, 2016 for U.S. Appl. No. 14/613,301, 43 pages.
Office Action dated Aug. 23, 2016 for U.S. Appl. No. 14/613,585, 9 pages.
Notice of Allowance dated Sep. 14, 2016 for U.S. Appl. No. 14/588,202, 119 pages.
Notice of Allowance dated Oct. 5, 2016 for U.S. Appl. No. 14/887,050, 113 pages.
Notice of Allowance dated Oct. 7, 2016 for U.S. Appl. No. 14/213,953, 43 pages.
Notice of Allowance for U.S. Appl. No. 14/509,967 dated Oct. 24, 2016, 42 pages.

(56) References Cited

OTHER PUBLICATIONS

Notice of Allowance for U.S. Appl. No. 14/383,079 dated Aug. 17, 2016, 71 pages.
Notice of Allowance for U.S. Appl. No. 14/611,022 dated Oct. 26, 2016, 41 pages.
Notice of Allowance for U.S. Appl. No. 13/952,467 dated Sep. 28, 2016, 128 pages.
Notice of Allowance for U.S. Appl. No. 15/046,172 dated Oct. 4, 2016, 116 pages.
Notice of Allowance for U.S. Appl. No. 14/612,025 dated Oct. 19, 2016, 108 pages.
Office Action for U.S. Appl. No. 14/597,151 dated Oct. 20, 2016, 52 pages.
Japanese Office Action mailed on Aug. 9, 2016 for Japanese Application No. 2014-513700, 8 pages. (including translation).
Chinese Office Action mailed on Sep. 1, 2016 for Chinese Application No. 201380027469.8, 8 pages. (including translation).
Office Action for U.S Appl. No. 14/588,136 dated Nov. 2, 2016, 132 pages.
Notice of Allowance for U.S. Appl. No. 14/692,677 dated Nov. 21, 2016, 97 pages.

\* cited by examiner

SWITCHING DEVICE HAVING A NON-LINEAR ELEMENT

CROSS REFERENCE TO RELATED APPLICATIONS

The instant application is a continuation of and claims priority to U.S. patent application Ser. No. 13/960,735, filed Aug. 6, 2013, which claims priority to and is a continuation of U.S. patent application Ser. No. 13/149,757, filed May 31, 2011, which is hereby incorporated by reference herein for all purposes.

BACKGROUND

The present invention is related to switching devices. More particularly, the present invention provides a structure and a method for forming non-volatile resistive switching memory devices characterized by a suppression of current at low bias and a high measured ON/OFF resistance ratio.

The success of semiconductor devices has been mainly driven by an intensive transistor down-scaling process. However, as field effect transistors (FET) approach sizes less than 100 nm, problems such as short channel effect start to prevent proper device operation. Moreover, such sub 100 nm device size can lead to sub-threshold slope non-scaling and increased power dissipation. It is generally believed that transistor based memories such as those commonly known as Flash memory may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon based devices to form a memory cell, which lack one or more key attributes. For example, Fe-RAM and MRAM devices have fast switching characteristics and good programming endurance, but their fabrication is not CMOS compatible and size is usually large. Switching for a PCRAM device uses Joules heating, which inherently has high power consumption. Organic RAM or ORAM is incompatible with large volume silicon based fabrication and device reliability is usually poor.

As integration of memory devices increases, the size of elements is reduced while the density of elements in a given area is increased. As a result, dark current or leakage current becomes more of a problem, where leakage current can return a false result for a read operation or cause an unintentional state change in a cell. The problem of leakage current is particularly acute in two-terminal devices, in which multiple memory cells can form leakage paths through interconnecting top and bottom electrodes.

Conventional approaches to suppressing leakage current in switching devices include coupling a vertical diode to a memory element. However, the external diode approach has several disadvantages. In general, the diode fabrication process is a high temperature process, typically conducted above 500 degrees Celsius. Because most diodes rely on a P/N junction, it is difficult to scale the diode height to achieve a memory and diode structure with a desirable aspect ratio. And finally, a conventional diode is only compatible with a unipolar switching device, and not a two-way bipolar device. It is therefore desirable to have a robust and scalable method and structure for a highly integrated memory that is not adversely affected by leak currents.

BRIEF SUMMARY OF THE INVENTION

The present invention is generally related to switching devices. More particularly, the present invention provides a structure and a method for forming a non-volatile memory cell using resistive switching. It should be recognized that embodiments according the present invention have a much broader range of applicability.

In a specific embodiment, a switching device includes a substrate; a first electrode formed over the substrate; a second electrode formed over the first electrode; a switching medium disposed between the first and second electrode; and a nonlinear element disposed between the first and second electrodes and electrically coupled in series to the first electrode and the switching medium. The nonlinear element is configured to change from a first resistance state to a second resistance state on application of a voltage greater than a threshold.

The switching device includes a RRAM in an embodiment.

The switching device include a PCRAM in an embodiment.

The present invention has a number of advantages over conventional techniques. For example, embodiments of the present invention allow for a high density non-volatile memory characterized by high switching speed, low leakage current characteristic, and high device yield. Depending on the embodiment, one or more of these may be achieved. These and other advantages will be described below in more detail in the present specification.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE PRESENT INVENTION

The present invention is generally directed to a memory device. More particularly, the present invention provides a structure and a method for a resistive switching cell having a nonlinear element. The switching cell may be used in a Resistive Random Access Memory (RRAM) or any highly integrated device. It should be recognized that embodiments of the present invention can have a broader range of applicability. Although the present invention is described with respect to specific embodiments, the embodiments are only used for illustrative purposes and should not be considered limiting.

RRAM is typically a two terminal device in which a switching element is sandwiched between a top electrode and a bottom electrode. The resistance of the switching element is varied by applying a voltage to the electrodes or a current through the switching element. Resistive switching can be bipolar or unipolar. In bipolar switching, the change in resistance of the switching element depends on polarity and a magnitude of a current or voltage based applied electrical signal. In the case of unipolar switching, the change in resistance of the switching element depends only on the magnitude of the applied voltage or current and typically is a result of Joule heating within the switching element. Embodiments of the present invention are explained with respect to a two-terminal RRAM device using bipolar switching, but are not limited thereto. As used herein, the terms "RRAM" or "resistive memory cell" refer to a memory cell or memory device that uses a switching medium whose resistance can be controlled by applying an electrical signal without ferroelectricity, magnetization, and phase change of the switching medium. The present invention is not limited to implementation in RRAM, e.g., the invention may be implemented using the phase change RAM.

Figure 1:
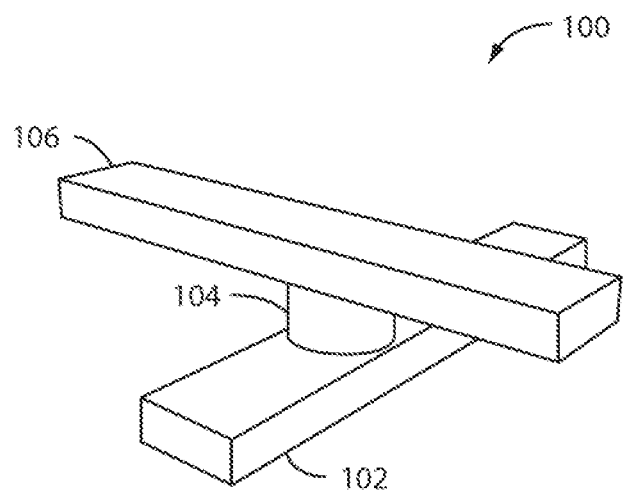
FIG. 1 illustrates a non-volatile memory device including a memory cell that has a bottom electrode, a switching medium, and a top electrode according to an embodiment of the present invention.

FIG. 1 illustrates a resistive memory cell 100 in a nonvolatile memory device, e.g., a semiconductor memory chip. The memory cell includes a bottom electrode 102, a switching medium 104, and a top electrode 106 according an embodiment of the present invention. The switching medium 104 exhibits a resistance that can be selectively set to various values and reset using appropriate control circuitry. The memory cell 100 is a two-terminal resistive memory device, e.g., RRAM, in the present embodiment.

Terms such as "top" or "bottom" are used for illustrative purpose only and should not construe to be limiting.

In the present embodiment, the memory cell 100 is an amorphous-silicon-based resistive memory cell and uses amorphous silicon (a-Si) as the switching medium 104. The resistance of the switching medium 104 changes according to formation or retrieval of a conductive filament inside the switching medium 104 according to a voltage applied to the electrodes. In an embodiment, the switching medium 104 is substantially free of dopants. In another embodiment, the switching medium 104 is a-Si doped with boron. The top electrode 106 is a conductive layer containing silver (Ag) and acts as the source of filament-forming ions in the a-Si structure. Although silver is used in the present embodiment, it will be understood that the top electrode 106 can be formed from various other suitable metals, such as gold (Au), nickel (Ni), aluminum (Al), chromium (Cr), iron (Fe), manganese (Mn), tungsten (W), vanadium (V), and cobalt (Co). In certain embodiments, the bottom electrode 102 is pure metal, a boron-doped electrode, or other p-type polysilicon or silicon-germanium, which is in contact with a lower-end face of the a-Si structure. In an embodiment, the memory cell 100 is configured to store more than a single bit of information, e.g., by adjusting the external circuit resistance, as explained in application Ser. No. 12/575,921, filed on Oct. 9, 2009, which is entitled "Silicon-Based Nanoscale Resistive Device with Adjustable Resistance" and is incorporated by reference in its entirety.

Figure 2:
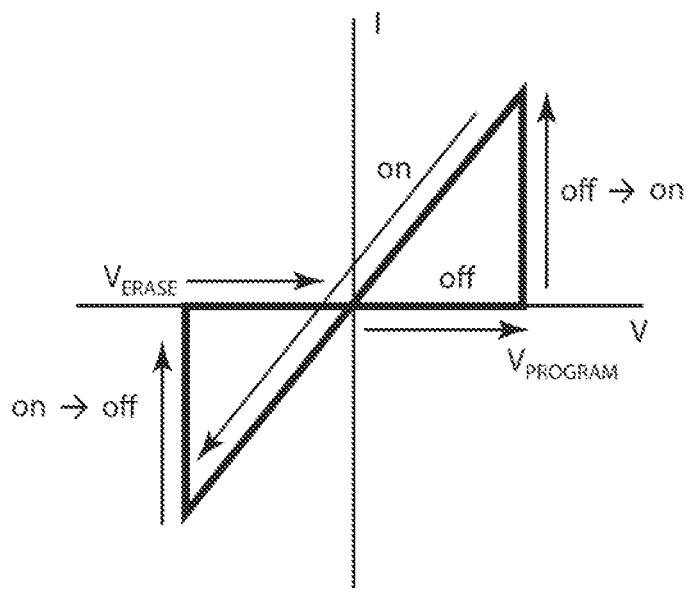
FIG. 2 illustrates I-V resistance switching characteristics of a resistive memory cell.

FIG. 2 illustrates resistance switching characteristics of the memory cell 100 according to an embodiment of the present invention. The switching medium 104 displays a bipolar switching effect. The resistance of the switching medium 104 changes depending on the polarity and magnitude of the voltage signal applied to the switching medium 104 via the top electrode 106 and the bottom electrodes 102. The memory cell 100 is changed into an ON state (low resistance state) when a positive voltage equal to or greater than a threshold program voltage (also referred to as a "program voltage") $V_{PROGRAM}$ is applied. In an embodiment, the program voltage ranges between 1 volt to 5 volts depending on the materials used for the switching medium 104 and the top electrode 106. In another embodiment, the program voltage ranges between 1 volt and 3 volts. The memory cell 100 is switched back to an OFF state (high resistance state) when a negative voltage equal to or greater than a threshold erase voltage (also referred to as "erase voltage") $V_{ERASE}$ is applied. In an embodiment, the erase voltage ranges from −2 volts to −5 volts. The cell state is not affected if the voltage applied is between two threshold voltages $V_{PROGRAM}$ and $V_{ERASE}$, which enables a low-voltage read process. Once the memory cell 100 is set to a specific resistance state, the memory cell 100 retains the information for a certain period (or retention time) without electrical power.

FIG. 2 illustrates a current-voltage (I-V) relationship through a switching operation of a non-rectifying memory cell 100. Electrical current flows from the top electrode 106 to the bottom electrode 102 when the potential applied to the top electrode 106 is positive potential with respect to the bottom electrode 102. On the other hand, current flows in the reverse direction if the potential applied to the top electrode 106 is negative with respect to the bottom electrode 102.

Figure 3A:
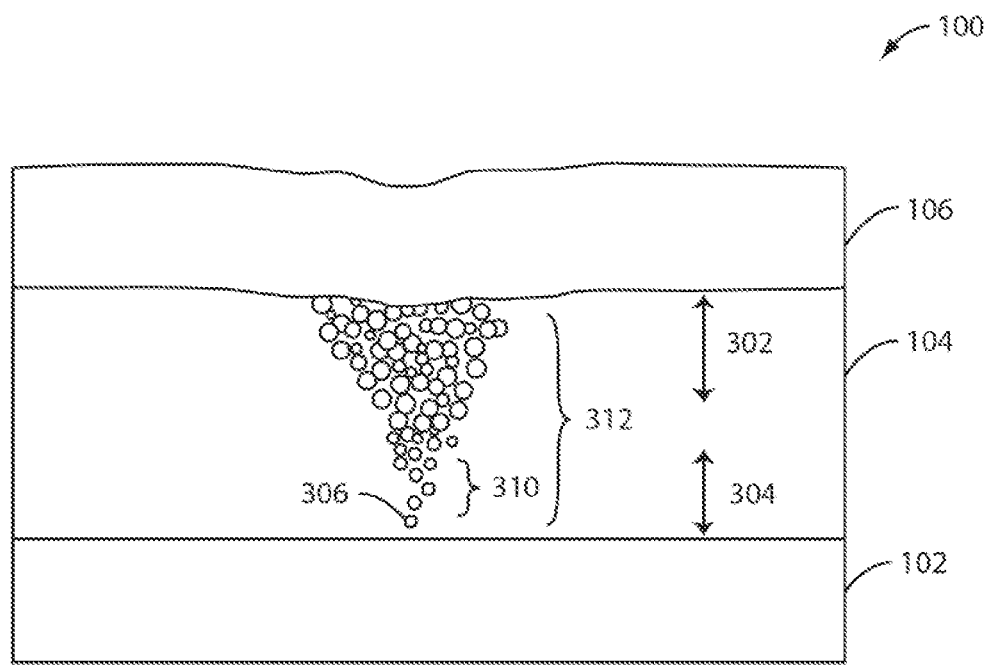
FIG. 3A illustrates a two-terminal memory cell that is placed in an ON state by applying a program voltage $V_{PROGRAM}$ to the top electrode.
Figure 3B:
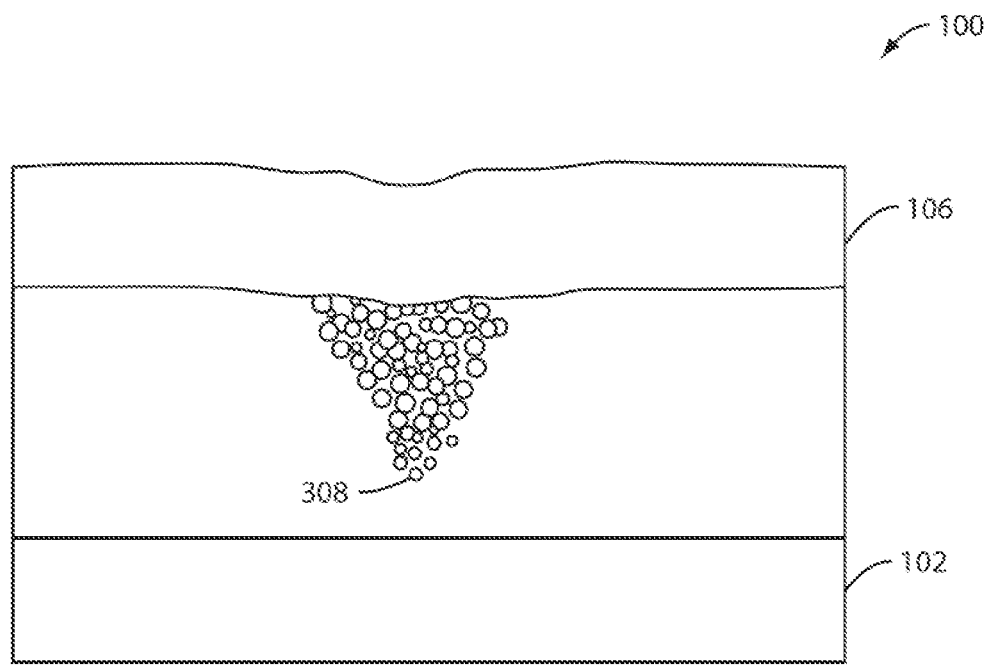
FIG. 3B illustrates a two-terminal memory cell that is placed in an OFF state by applying an erase voltage $V_{ERASE}$ to the top electrode.

FIGS. 3A and 3B illustrate a switching mechanism of the memory cell 100 during the ON and OFF states according to an embodiment of the present invention. The switching in the switching medium 104 is based on formation and retrieval of a conductive filament, or a plurality of filaments, in a filament region in the switching medium 104 according to the program and the erase voltages applied to the bottom electrode 102 and the top electrode 106 of the memory cell 100.

FIG. 3A illustrates the memory cell 100 that is placed in an ON state by applying the program voltage $V_{PROGRAM}$ to the top electrode 106. The switching medium 104, made of a-Si, is provided between the bottom electrode 102 and the top electrode 106. An upper portion of the switching medium 104 includes a metallic region (or conductive path) 302 that extends from the top electrode 106 to approximately 10 nm above the bottom electrode 102. The metallic region 302 is formed during an electroforming process when a slightly larger voltage than a subsequent switching voltage, e.g., 3~5 V, is applied to the top electrode 106. This large voltage causes the electric field-induced diffusion of the metal ions from the top electrode 106 toward the bottom electrode 102, thereby forming a continuous conductive path 312. A lower portion of the switching medium 104 defines a filament region 304, wherein the filament 310 is formed when the program voltage $V_{PROGRAM}$ is applied after the electroforming process. The continuous conductive path 312 and the filament 310 can also be formed together during the electroforming process. The filament 310 comprises a series of metal particles, which are trapped in defect sites in a lower portion of the switching medium 104 when the program voltage $V_{PROGRAM}$ applied provides sufficient activation energy to push a number of metal ions from the metallic region 302 toward the bottom electrode 102.

The filament 310 is believed to be comprised of a collection of metal particles that are separated from each other by the non-conducting switching medium 104 and that do not define a continuous conductive path, unlike the continuous conductive path 312 in the metallic region 302. The filament 310 extends about 2 to 10 nm depending on implementation. The conduction mechanism in an ON state is electrons tunneling through the metal particles in the filament 310. The cell resistance is dominated by the tunneling resistance between the metal particle 306 and the bottom electrode 102. The metal particle 306 is a metal particle in the filament region 304 that is closest to the bottom electrode 102 and that is the last metal particle in the filament region 304 in an ON state.

FIG. 3B illustrates the memory cell 100 that is placed in an OFF state by applying an erase voltage $V_{ERASE}$ to the top electrode 106. The erase voltage exerts sufficient electromagnetic force to dislodge the metal particles trapped in the defects sites of the a-Si and retrieves at least part of the filament 310 from the filament region 304. The metal particle 308 that is closest to the bottom electrode 102 in an OFF state is separated from the bottom electrode 102 by a distance greater than the metal particle 306 during an ON state. This increased distance between the metal particle 308 and the bottom electrode 102 places the memory cell 100 in a high resistance state compared to an ON state. In an embodiment, the resistance ratio between ON/OFF states ranges from 10E3 to 10E7. Memory cell 100 behaves like a resistor in an ON state and a capacitor in an OFF state (i.e., the switching medium 104 does not conduct a current in any meaningful amount and behaves as a dielectric in an OFF state). In an implementation, the resistance is 10E5 Ohm in an ON state and 10E10 Ohm in an OFF state. In another implementation, the resistance is 10E4 Ohm in an ON state and 10E9 Ohm in an OFF state. In yet another implementation, the resistance is at least 10E7 Ohm in an OFF state.

Figure 4:
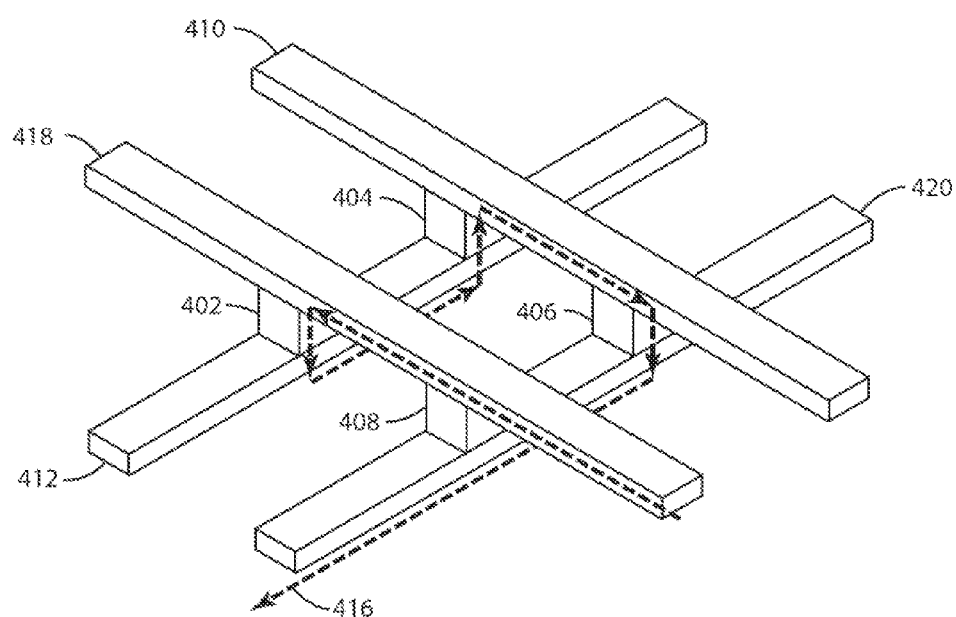
FIG. 4 illustrates a memory array including a leakage current.

FIG. 4 illustrates a portion of an array 400 that is in a crossbar configuration in which the top electrode and the bottom electrode are arranged in an orthogonal manner according to an embodiment of the present invention. An array of such crossbar structures includes a plurality of parallel top electrodes and a plurality of parallel bottom electrodes with switching elements disposed between the intersection regions of the top electrodes and the bottom electrodes. Certain limitations may exist in such a configuration, as described below.

Four memory cells 402, 404, 406, and 408 are shown. Memory cells 404 and 406 share a common first top electrode 410, while cells 402 and 408 share a common second top electrode 418. The first top electrode 410 and the second top electrode 418 are arranged parallel to each other. Memory cells 402 and 404 share a common first bottom electrode 412 and cells 406 and 408 share a common second bottom electrode 420. The first bottom electrode 412 and the second bottom electrode 420 are spatially arranged parallel to each other. In addition, each of the top electrodes is configured to be non-parallel to each of the bottom electrodes.

To determine a state of a target cell which has a high resistance state, a voltage is applied and a current flowing through the target cell is measured. If some cells in the crossbar array are in low resistance states, the voltage applied to the target cell can cause a leakage current to flow through the untargeted cells instead. In this case the cells causing the leakage, including the target cell, are interconnected through shared electrodes. The leakage current can form a current path, commonly known as a sneak current or a sneak current path, through these untargeted cells. Such a sneak current can cause undesirable behavior in a switching array.

For example, in an exemplary array, cells 402, 404, and 406 are at a low resistance ON state, and cell 408 is at a high resistance OFF state. Because the ON state is characterized by a low resistance, a sneak path 416 may be formed allowing current to flow through cells 402, 404, and 406. Thus, when a read voltage is applied to target cell 408, leakage current flowing along sneak path 416 may cause an erroneous reading of an ON state result.

In some embodiments, a sneak path can be very short, existing in as few as two forward biased cells and one reverse biased cell. In addition, once started, a sneak path can propagate throughout the array through cells in the ON state. The most common conductive path in a switching array is the shared top and bottom electrodes. Sneak path 416 is only one example of a sneak path passing leakage current through an array.

To mitigate problems caused by leakage current in a switching array, a nonlinear element (NLE) may be included in a resistive switching device. NLEs can be generally divided into two categories: an NLE that exhibits digital-like behavior, or "digital NLE," and an NLE that exhibits analog-like behavior, or an "analog NLE," both of which are described in detail separately below. The categories of digital and analog behavior are not strictly defined, so it is possible for a particular NLE to have properties that are characteristic of both digital and analog behavior, or somewhere in between. In its most basic form, an NLE is an element that has a nonlinear response with respect to voltage, for instance, with a nonlinear I-V relationship. In most embodiments, the relationship is characterized by a high resistance state at low amplitude voltages and a lower resistance state at higher amplitude voltages, with a nonlinear transition from the high resistance state to the low resistance state. Unlike a switching medium, an NLE does not have a memory characteristic; an NLE returns to an original state when a voltage is no longer applied. An NLE that is suitable for suppressing leak currents is characterized by a high resistance state at a low bias, a lower resistance state at a higher bias, and a threshold between the states.

In an embodiment, an NLE is a two terminal device which shows an apparent threshold effect such that the resistance measured below a first voltage is significantly higher than the resistance measured above a second voltage. In a typical embodiment, the resistance below the first voltage is more than 100 times greater than the resistance above the second voltage. In some embodiments, the first and second voltages are different, and are typically referred to as a hold voltage $V_{HOLD}$ and threshold voltage $V_{TH}$, respectively. In other embodiments, the first voltage and second voltage may be the same. In various embodiments, these relationships may exist in both polarities of voltage, or only in one polarity, and the NLE can be a single material or multiple layers of different materials.

Figure 5:
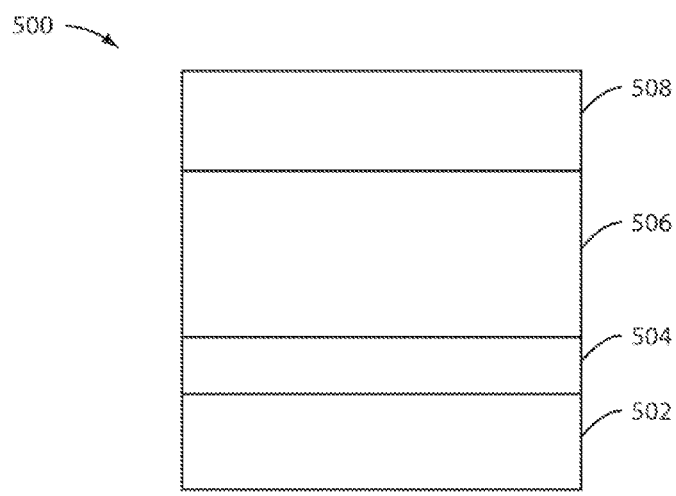
FIG. 5 illustrates a non-volatile memory cell including a nonlinear element according to an embodiment of the present invention.

As shown in FIG. 5, to mitigate the effects of leakage current in a memory cell 500, an NLE 504 is electrically coupled in series to the top electrode 508, bottom electrode 502, and switching medium 506. An NLE 504 may be disposed between the bottom electrode 502 and switching medium 506. In other embodiments, the NLE is disposed between the top electrode 508 and the switching medium 506. Higher temperatures may be experienced by the lower portions of a semiconductor device during various semiconductor processes, so an NLE that is located lower in a stack structure may be designed to withstand higher temperatures than an NLE located further from the substrate.

Figure 6A:
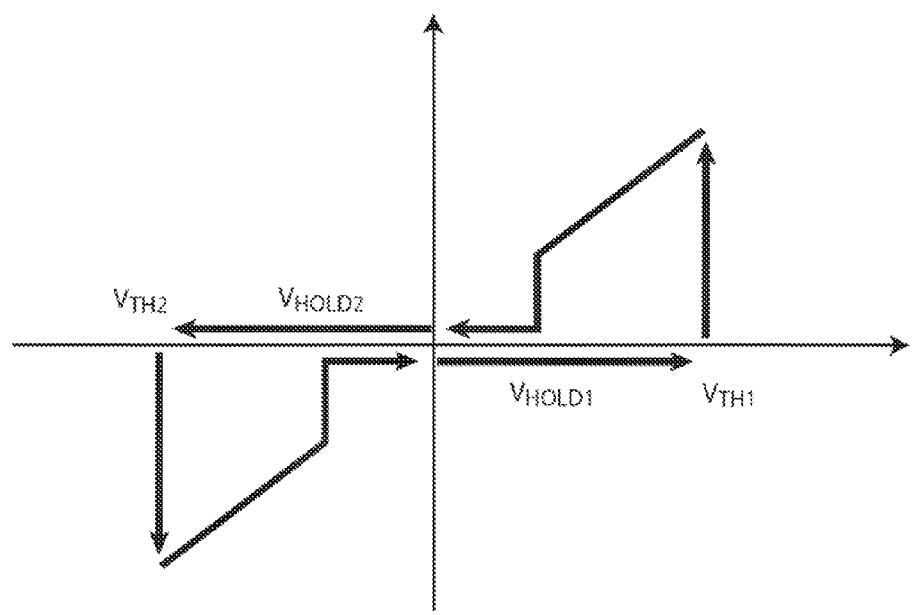
FIG. 6A illustrates I-V characteristics of a digital nonlinear element subjected to a voltage sweep.

The behavior of a digital NLE is characterized by abrupt changes in current at certain voltages, which may be referred to as threshold voltages. Such behavior is illustrated in FIG. 6A, which shows the results of a voltage sweep in an embodiment with respect to current on an NLE that is not coupled to a resistive switching device. As positive bias voltage is applied to the NLE, the NLE is in a resistive state characterized by high resistance until it reaches the threshold voltage $V_{TH1}$. After this threshold has been reached, the NLE will retain its conductive state until the applied voltage drops below a hold voltage $V_{HOLD1}$. Thus a NLE that is in a conductive state by having a voltage applied above $V_{TH1}$ will continue to have a low resistance so long as a voltage above $V_{HOLD1}$ is supplied to the NLE, after which it reverts to the original high-resistance state. An NLE does not have a memory characteristic, so the same I-V relationship is experienced every time a voltage is applied from an original state.

Referring back to FIG. 6A, when a negative bias voltage is applied that is more negative than a threshold voltage $V_{TH2}$, an abrupt transition is experienced, and the resistance in the NLE is significantly reduced. The NLE retains its low resistance state until the voltage becomes less negative than a value $V_{HOLD2}$, at which point the NLE reverts to an original high resistance state. Although FIG. 6A shows an embodiment with symmetrical I-V behavior between positive and negative bias performance, in other embodiments the relationship is not symmetrical.

Figure 6B:
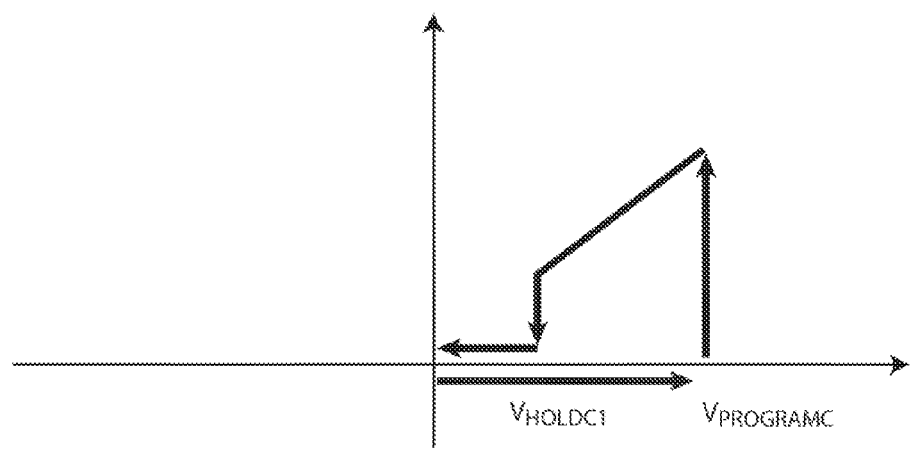
FIG. 6B illustrates I-V characteristics of a switch combined with a digital nonlinear element in an initially OFF state subjected to a positive voltage sweep.

FIGS. 6B to 6E show I-V relationships of an embodiment where an NLE is coupled to a memory cell ("combined device"), in this case a digital NLE. Memory cell 500 is an example of such a combined device. If the memory cell depicted in those figures was not coupled to the NLE, it would have an I-V response according to FIG. 2. Turning to FIG. 6B, an I-V curve showing a program operation switching a cell from an initially OFF state to an ON state is shown. To establish a conductive ON state in a cell, a voltage above $V_{PROGRAMC}$ is applied. $V_{PROGRAMC}$ is the program voltage for the combined device, which switches the combined device from an OFF state to an ON state. $V_{HOLDC1}$ is the hold voltage of a combined device, which performs in essentially the same way as $V_{HOLD1}$ described above. In a preferred embodiment, $V_{HOLD1}$ is less than $V_{TH1}$, which is less than $V_{PROGRAM}$.

The relationships between I-V performance in a memory cell, an NLE, and a combined device can also be explained through equations. The equations assume that both the NLE and the switching medium switch instantly (e.g., a few ns~a few hundreds of ns) when experiencing a threshold voltage. In addition to the definitions given above, the following variables are designated:

$R_{MOFF}$=The OFF state resistance of a memory element
$R_{MON}$=The ON state resistance of a memory element
$R_{NOFF}$=The OFF state resistance of an NLE
$R_{NON}$=The ON state resistance of an NLE Using these variables, the relationship between the hold voltage of a combined device and the hold voltage of an NLE can be expressed as:

$$V_{HOLDC1} = \frac{R_{MON} + R_{NON}}{R_{NON}} V_{HOLD1}$$

The value for the program voltage of the combined device can be expressed as:

$$V_{PROGRAMC} \cong \text{small}\left\{\text{large}\left(\frac{R_{MOFF} + R_{NOFF}}{R_{NOFF}} V_{TH1}, V_{PROGRAM}\right),\right.$$
$$\left.\text{large}\left(V_{TH1}, \frac{R_{MOFF} + R_{NOFF}}{R_{MOFF}} V_{PROGRAM}\right)\right\}$$

Where "small" indicates the smaller of two values in a set, and "large" indicates the larger of two values in a set. In most embodiments, the $V_{PROGRAM}$ is significantly higher than $V_{TH1}$, and $V_{PROGRAMC}$ is thus similar to $V_{PROGRAM}$.

Figure 6C:
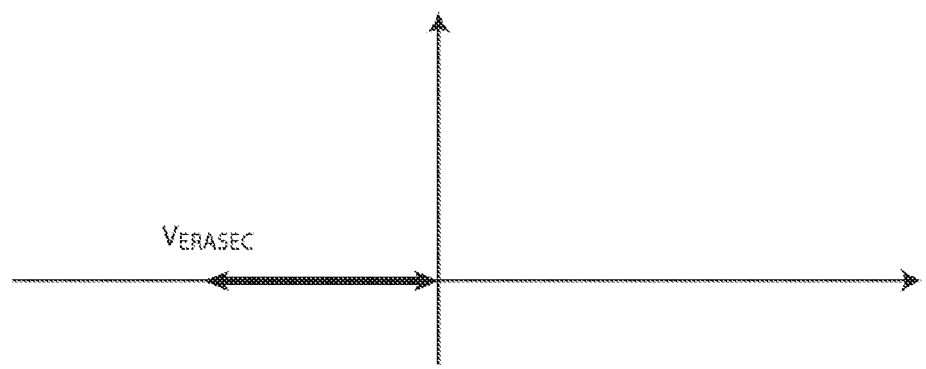
FIG. 6C illustrates I-V characteristics of a switch combined with a digital nonlinear element in an initially OFF state subjected to a negative voltage sweep.

FIG. 6C shows the result of a negative voltage sweep of the same switch in an OFF state. Because it is already in the OFF state, a negative voltage does not cause an erase operation, and the cell remains in a high resistance OFF state.

Figure 6D:
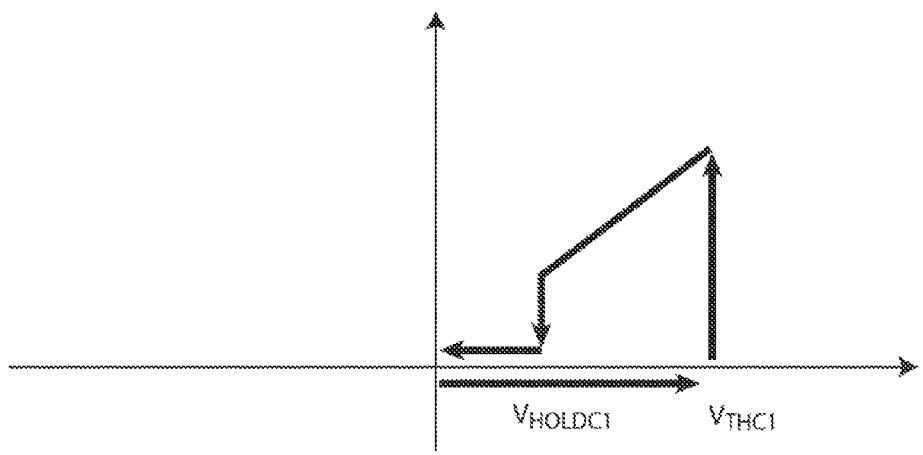
FIG. 6D illustrates I-V characteristics of a switch combined with a digital nonlinear element in an initially ON state subjected to a positive voltage sweep.
Figure 6E:
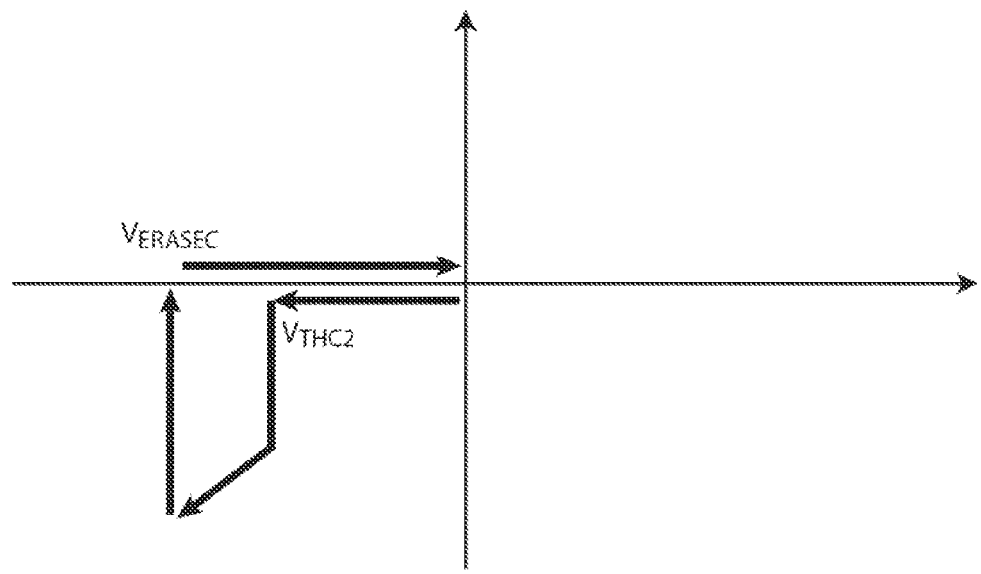
FIG. 6E illustrates I-V characteristics of a switch combined with a digital nonlinear element in an initially ON state subjected to a negative voltage sweep.

FIGS. 6D and 6E show I-V relationships of a combined device (e.g. memory cell 500) where the memory cell is initially in a low-resistance ON state. FIG. 6D shows a read operation, where the read voltage must be greater than threshold voltage $V_{THC1}$ to return an accurate read value. As the read voltage drops below the hold voltage $V_{HOLDC1}$, the resistance in the cell increases substantially. The threshold voltage of the combined device is related to the threshold voltage of the NLE through the following equation:

$$V_{THC1} = \frac{R_{MON} + R_{NOFF}}{R_{NOFF}} V_{TH1} \approx \cong V_{TH1}$$

Thus, the read threshold voltage of the combined device is approximately the same as the threshold voltage of the NLE, or $V_{THC1} \approx V_{TH1}$.

Similarly, as seen in FIG. 6E, an erase operation must overcome a second threshold value $V_{THC2}$ to allow current to start flowing through the cell, and the switch is changed to a high-resistance OFF state at voltage $V_{ERASEC}$. Like the positive threshold voltage, the negative threshold voltage of the combined device is about the same as the negative threshold voltage of the NLE. The value of the erase voltage $V_{ERASEC}$ in a combined device can be expressed as:

$$V_{ERASEC} \cong large\left(\frac{R_{MON} + R_{NON}}{R_{MON}} V_{ERASE}, V_{TH2}\right)$$

The relationship between the negative threshold voltages of a discrete and combined device can be expressed as:

$$V_{THC2} = \frac{R_{MON} + R_{NOFF}}{R_{NOFF}} V_{TH2} \cong V_{TH2}$$

So that in most embodiments, $V_{THC2} \approx V_{TH2}$.

Various embodiments of a digital NLE can be made of many different materials. For example, a digital NLE can be a threshold device such as a film that experiences a field-driven metal-insulating (Mott) transition. Such materials are known in the art, and include $VO_2$ and doped semiconductors. Other threshold devices include material that experiences resistance switching due to electronic mechanisms observed in metal oxides and other amorphous films, or other volatile resistive switching devices such as devices based on anion or cation motion in oxides, oxide heterostructures, or amorphous films. A digital NLE can also be in the form of a breakdown element exhibiting soft breakdown behavior such as $SiO_2$, $HfO_2$, and other dielectrics. Examples of such breakdown elements are described in further detail by application Ser. No. 12/826,653, filed on Jun. 29, 2010, which is entitled "Rectification Element for Resistive Switching for Non-volatile Memory Device and Method," and is incorporated by reference in its entirety. This reference discloses that additional materials may be used for a switching medium, for a NLE, for electrodes, and the like. In light of that disclosure, embodiments of the present invention may have a switching medium that includes: metal oxides such as ZnO, WO3, TiOx, NiO, CuO, or chalcogenide glass, organic materials, polymeric materials (inorganic or organic), and others. Additionally, in light of this disclosure, embodiments of the present invention may have an NLE that includes: an oxide dielectric material such as HfO2, a dielectric material or a combination of dielectric materials. Further, in light of this disclosure, the electrodes may be a metal or an alloy.

As is known in the art, the precise values of threshold, hold, program and erase can be adjusted for different embodiments by changing the form of and materials used for the NLE and the memory cell. In various embodiments the threshold voltage for the NLE can be about the same as the hold voltage, the program voltage, or both. In other embodiments the threshold voltage for the NLE can exceed the program and erase voltages of a resistive switching device.

Figure 7A:
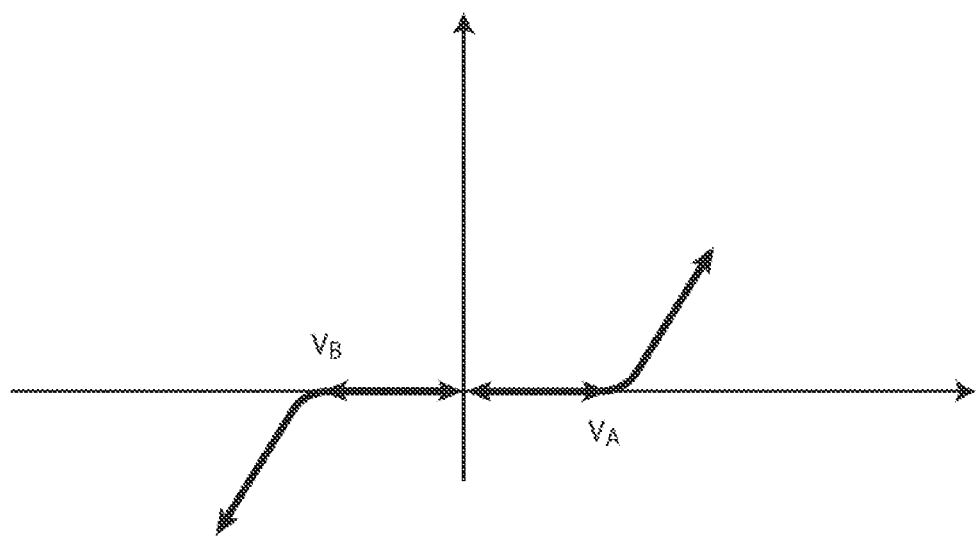
FIG. 7A illustrates I-V characteristics of an analog nonlinear element subjected to a positive voltage sweep.

An analog NLE differs from a digital NLE in that its I-V relationship is characterized by a more gradual transition when current starts to flow through the element. As shown in FIG. 7A, which illustrates the response of an analog NLE to a voltage sweep, the current transition follows an exponential-like curve. The transition or threshold is therefore less abrupt than a digital NLE. Threshold voltage values where substantial current starts to flow through an analog NLE are designated as $V_A$ and $V_B$ for positive and negative bias values, respectively. Another significant difference between an analog and digital NLE is that an analog NLE does not experience the hysteretic hold voltage characteristic of a digital NLE.

Figure 7B:
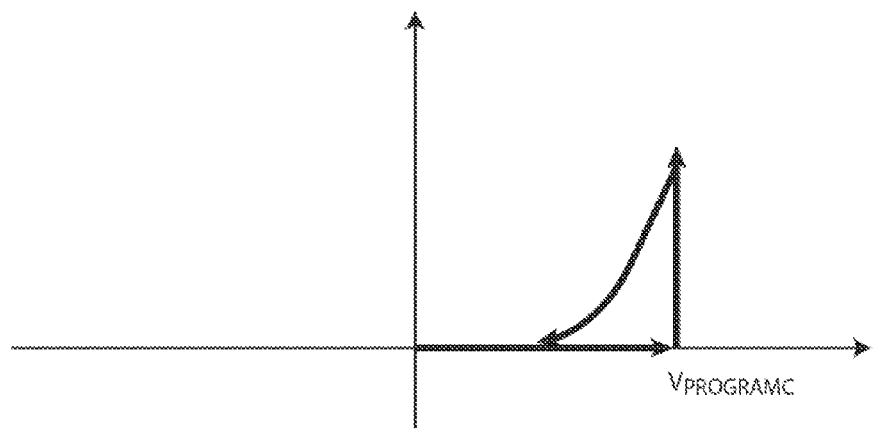
FIG. 7B illustrates I-V characteristics of a switch combined with an analog nonlinear element in an initially OFF state subjected to a positive voltage sweep.

FIGS. 7B to 7E show I-V characteristics of a combined device with an analog NLE. As shown in FIG. 7B, when a program voltage $V_{PROGRAMC}$ is applied to a combined device where the switch is initially in an OFF state, the switch changes to a low resistance ON state. The $V_{PROGRAMC}$ is approximately the sum of the $V_A$ of the NLE and the $V_{PROGRAM}$ of the switch as shown in FIG. 2, or $V_{PROGRAMC} \approx V_A + V_{PROGRAM}$. As a result, the programming voltage of a combined device with an analog NLE is typically higher than the programming voltage of a switching element alone.

Figure 7C:
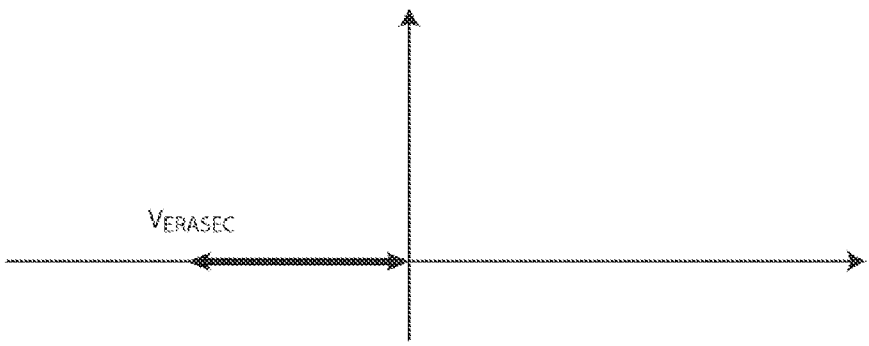
FIG. 7C illustrates I-V characteristics of a switch combined with an analog nonlinear element in an initially OFF state subjected to a negative voltage sweep.

Turning now to FIG. 7C, a negative voltage sweep of a combined device in an OFF state is shown. Because the switch is already in an OFF state, the negative voltage does not induce a state change, and the switch remains in a high resistance state.

Figure 7D:
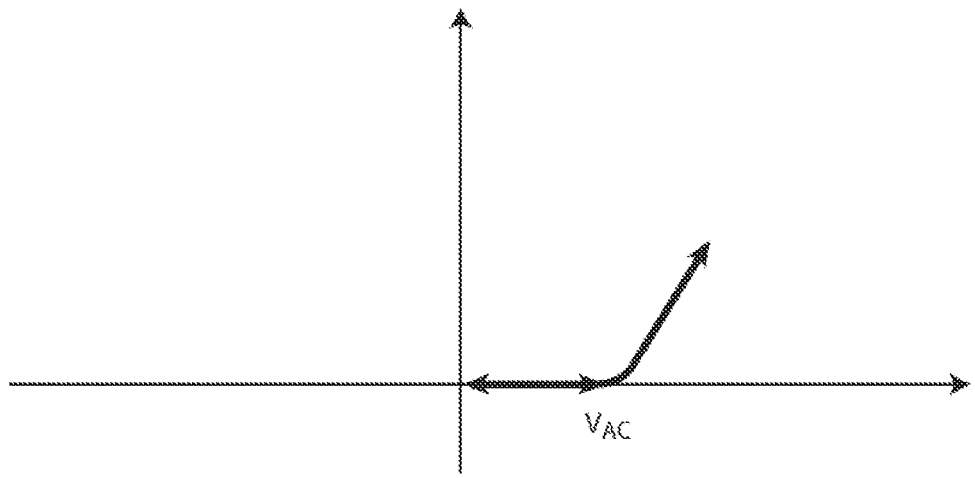
FIG. 7D illustrates I-V characteristics of a switch combined with an analog nonlinear element in an initially ON state subjected to a positive voltage sweep.

FIG. 7D shows the result of a read operation in a combined switch that is in an ON state. In the present embodiment, $V_{AC} < V_{READ} < V_{PROGRAMC}$. Because the switch is already in a low-resistance ON state, current flow above the threshold voltage $V_{AC}$ is characterized by low resistance. Circuitry can detect the current flow, resulting in a positive read result. The value for $V_A$ is not affected by the switching apparatus in most embodiments, so typically $V_{AC} \approx V_A$.

Figure 7E:
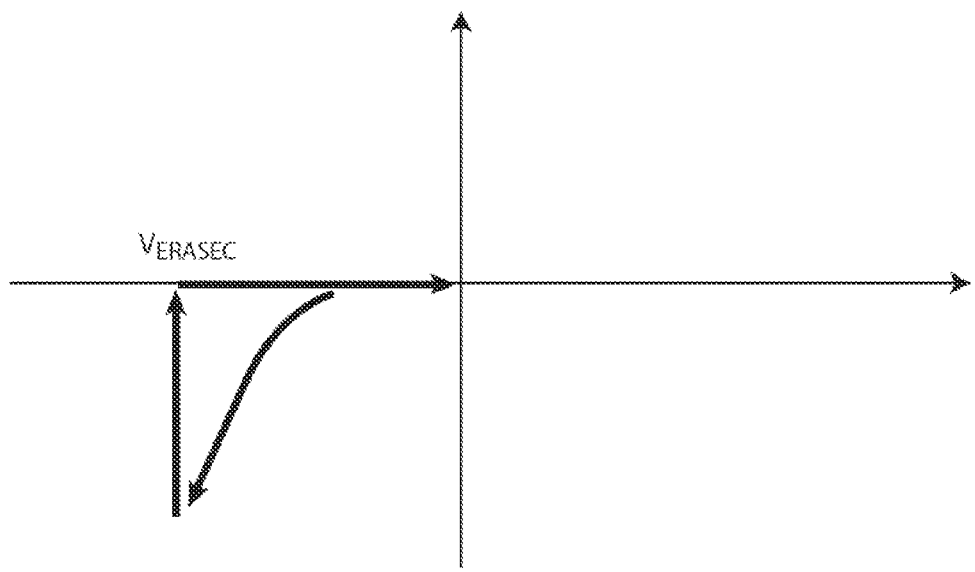
FIG. 7E illustrates I-V characteristics of a switch combined with an analog nonlinear element in an initially ON state subjected to a negative voltage sweep.

FIG. 7E shows an I-V curve for an erase operation in a combined device. To change the switch from the ON state to the OFF state, a voltage of $V_{ERASEC}$ is applied to the combined device, thereby increasing the resistance of the switch. The voltage required to complete an erase operation in a combined device is normally the sum of the erase value of the discrete switch and the threshold value of the analog NLE, or $V_{ERASEC} \approx V_{ERASE} + V_B$.

An analog NLE can be any element that exhibits the above described behavior. Examples of suitable materials include a punch-through diode, a Zener diode, an impact ionization (or avalanche) element, and a tunneling element such as a tunneling barrier layer. Such elements can be fabricated using standard fabrication techniques.

In most embodiments, $|V_A, V_B| < |V_{PROGRAM}, V_{ERASE}|$. As is known in the art, the precise threshold values of $V_A$, $V_B$, program, and erase can be adjusted for different embodiments by changing the form of and materials used for the NLE and the memory cell. In various embodiments the threshold voltage for the NLE can be about the same as the program voltage. In other embodiments the threshold voltage can exceed the program and erase voltages.

In other embodiments, a resistive switching cell may be configured to retain multiple resistive states. That is, rather than being configured to have binary states of ON and OFF, a cell can retain a plurality of resistance states. An array of such switches has the same limitations regarding leakage current, and would similarly benefit from the inclusion of an NLE.

The examples and embodiments described herein are for illustrative purposes only and are not intended to be limiting. Various modifications or alternatives in light thereof will be suggested to persons skilled in the art and are to be included within the spirit and purview of this application and scope of the appended claims.

What is claimed is:

1. A method for a semiconductor device having a plurality of memory devices formed between intersections of a first plurality of electrodes and a second plurality of electrodes, the method comprising:

applying a read threshold voltage across a first electrode from the first plurality of electrodes and a second electrode from the second plurality of electrodes, to thereby change a resistance state of a non-linear element in a first memory device that is coupled to the first electrode and the second electrode, from a high resistance state to a low resistance state, wherein the read threshold voltage is greater than a threshold voltage associated with the non-linear element, and wherein the read threshold voltage is less than a program threshold voltage associated with a first memory cell in the first memory device;

applying a read voltage across the first electrode and the second electrode to thereby promote a first current flow through the first memory device, wherein the read voltage:
is applied while the resistance state of the non-linear element is the low resistance state,
is greater than a hold voltage associated with the non-linear element, and
is less than the read threshold voltage; and determining a resistance state associated with the first memory cell of the first memory device in response to the first current flow.

2. The method of claim 1 wherein the read voltage is less than the threshold voltage associated with the non-linear element.

3. The method of claim 1 further comprising:
removing the read voltage across the first electrode and the second electrode to thereby change the resistance state of the non-linear element from the low resistance state to the high resistance state, while maintaining the resistance state of the first memory cell in the ON state.

4. The method of claim 1 further comprising:
applying an erase voltage across the first electrode and the second electrode to thereby change the resistance state of the non-linear element from the high resistance state to the low resistance state or to thereby maintain the resistance state of the non-linear element in the low resistance state, and to thereby change the second resistance state of the first memory cell from an ON state to an OFF state, wherein the erase voltage is greater than an erase threshold voltage associated with the first memory cell in the first memory device.

5. The method of claim 1 further comprising removing the read voltage from across the first electrode and the second electrode to thereby change the resistance state of the non-linear element from the low resistance state to the high resistance state, and to thereby change a third resistance state of the first memory device to a high resistance state.

6. The method of claim 1
wherein the applying the read threshold voltage across the first electrode and the second electrode does not cause a third resistance state of a second non-linear element in a second memory device coupled to the first electrode to change to a low resistance state, and does not cause a resistance state of a fourth non-linear element in a third memory device coupled to the second electrode to change to a low resistance state.

7. The method of claim 6
wherein the second memory device is coupled to a third electrode;
wherein the third memory device is coupled to a fourth electrode; and
wherein the applying the read threshold voltage across the first electrode and the second electrode does not cause a fifth resistance state of a fourth non-linear element in a fourth memory device coupled to the third electrode and the fourth electrode to change to a low resistance state.

8. The method of claim 1 further comprising applying a program voltage across the first electrode and the second electrode to thereby change the resistance state of the nonlinear element from the high resistance state to the low resistance state or to thereby maintain the resistance state of the non-linear element in the low resistance state, and to thereby change the second resistance state of the first memory cell from an OFF state to an ON state, wherein the program voltage is greater than a program threshold voltage associated with the first memory cell in the first memory device.

9. The method of claim 8 further comprising:
removing the program voltage across the first electrode and the second electrode to thereby change the resistance of the non-linear element from the low resistance state to the high resistance state;
wherein the applying the program voltage across the first electrode and the second electrode causes metal particles in the first electrode to diffuse within the first memory cell, and
wherein when removing the program voltage from across the first electrode and the second electrode, at least some of the metal particles become trapped within defect sites of the first memory cell and form a conductive filament within the first memory cell.

10. The method of claim 9 wherein the metal particles are selected from a group of particles consisting of: silver, gold, nickel, and aluminum.

11. A semiconductor device comprises
a first plurality of electrodes;
a second plurality of electrodes;
a plurality of memory devices formed between intersections of the first plurality of electrodes and the second plurality of electrodes, wherein each of the plurality of memory devices comprises:
a memory cell disposed adjacent to a first electrode of the first plurality of electrodes, wherein the memory cell has a resistance state that is associated with at least a high resistance state or a low resistance state, wherein the memory cell is associated with a program threshold voltage, and wherein the resistance state of the memory cell is configured to change from the high resistance state to the low resistance state upon application of a voltage higher than the program threshold voltage; and
a non-linear element disposed adjacent to a second electrode of the second plurality of electrodes, wherein the non-linear element is associated with at least a high resistance state or a low resistance state, wherein the non-linear element is associated with a threshold voltage, wherein the resistance state of the non-linear element is configured to change from the high resistance state to the low resistance state upon application of a voltage higher than the threshold voltage, wherein the non-linear element is associated with a hold voltage, wherein the resistance state of the non-linear element is configured to be maintained in the low resistance state upon application of a voltage higher than the hold voltage, wherein the hold voltage is less than the threshold voltage, and wherein the threshold voltage is less than the program threshold voltage.

12. The semiconductor device of claim 11 wherein a ratio between the high resistance state of the memory cell and the low resistance state of the memory cell is within a range of about 10E5 to about 10E10.

13. The semiconductor device of claim 11
wherein the memory cell is associated with a read voltage;
wherein the memory cell is configured to produce a read current in response to a resistance state of the memory cell and to the read voltage;
wherein the read voltage is greater than the hold voltage; and
wherein the read voltage is less than the program threshold voltage.

14. The semiconductor device of claim 11
wherein the memory cell is associated with an erase threshold voltage;
wherein the resistance state of the memory cell is configured to change from the low resistance state to the high resistance state upon application of an erase voltage of same polarity and higher magnitude than the erase threshold voltage; and
wherein the resistance state of the non-linear element is configured to change from the high resistance state to the low resistance state upon application of the erase voltage.

15. The semiconductor device of claim 11 wherein the resistance state of the non-linear element is configured to change from the low resistance state to the high resistance state upon absence of a voltage across the non-linear element having a higher magnitude than the hold voltage.

16. The semiconductor device of claim 11 wherein the first electrode comprises metal or a metal alloy including a metal selected from a group consisting of: gold, nickel, and aluminum.

17. The semiconductor device of claim 16 wherein metal particles from the first electrode are diffused within the memory cell.

18. The semiconductor device of claim 17 wherein the metal particles are trapped within defects within the memory cell and form a conductive filament within the memory cell.

19. The semiconductor device of claim 11 wherein the memory cell comprises a resistive switching material selected from a group consisting of: a metal oxide, ZnO, W03, TiOx, NiO, CuO, and a chalcogenide glass.

20. The semiconductor device of claim 11 wherein the non-linear element comprises a material selected from a group consisting of: an oxide material, Hf02, a dielectric material, and a combination of dielectric materials.

* * * * *